(12) United States Patent
Lee

(10) Patent No.: US 6,589,828 B2
(45) Date of Patent: Jul. 8, 2003

(54) FABRICATING A THIN FILM TRANSISTOR HAVING BETTER PUNCH THROUGH RESISTANCE AND HOT CARRIER EFFECTS

(75) Inventor: Sung Kwon Lee, Kyoungki-do (KR)

(73) Assignee: Hyundai Electronics Industries Co., Ltd., Ichon-shi (KR)

(*) Notice: Subject to any disclaimer, the term of this patent is extended or adjusted under 35 U.S.C. 154(b) by 0 days.

(21) Appl. No.: 09/737,774

(22) Filed: Dec. 18, 2000

(65) Prior Publication Data
US 2001/0004537 A1 Jun. 21, 2001

(30) Foreign Application Priority Data
Dec. 18, 1999 (KR) .......................... 1999-58887

(51) Int. Cl.⁷ ................. H01L 21/00; H01L 21/84
(52) U.S. Cl. ........................... 438/162; 257/351
(58) Field of Search ................. 438/162, 163, 438/149, 174; 257/347, 351

(56) References Cited

U.S. PATENT DOCUMENTS 5,910,672 A * 6/1999 Iwamatsu et al. ........... 257/219
6,184,070 B1 * 2/2001 Park ........................... 438/159
6,214,652 B1 * 4/2001 Batra et al. ................... 257/66
6,255,146 B1 * 7/2001 Shimizu et al. ............... 117/8

OTHER PUBLICATIONS

Kuroi, et al., Novel NICE (Nitrogen Implantatin into CMOS Gate Electrode and Source–Drain) Structure for High Reliability and High Performance 0.25 um Dual Gate CMOS, IEEE, Electron Device Meeting, Dec. 1993 pp 325–328.*

* cited by examiner

Primary Examiner—William David Coleman
(74) Attorney, Agent, or Firm—Pillsbury Winthrop LLP

(57) ABSTRACT

Fabricating thin film transistors. A gate electrode is formed on a substrate. A gate oxide film is then formed on the gate electrode. A polysilicon layer is deposited on the gate oxide film. An impurity ion is implanted into the polysilicon layer to control a threshold voltage of the polysilicon layer. A mask is formed on the polysilicon layer above the gate electrode, having the same width as the gate electrode. A second impurity ion is implanted into the exposed portion of the polysilicon layer using the mask, to form a lightly doped offset region on a drain region. The mask is removed. A second mask is formed on the polysilicon layer so as to cover a portion of the gate electrode and the light doped offset region. A Third impurity ion is implanted into the polysilicon layer using the second mask to form source/drain regions. The mask is removed.

10 Claims, 4 Drawing Sheets

FABRICATING A THIN FILM TRANSISTOR HAVING BETTER PUNCH THROUGH RESISTANCE AND HOT CARRIER EFFECTS

BACKGROUND OF THE INVENTION

1. Field of the Invention

The present invention relates to a method for fabricating thin film transistors and, more particularly, to a method for fabricating a thin film transistor having improved electrical properties.

2. Description of the Related Art

Thin film transistors are commonly used as a driving device for liquid crystal displays or as a pull-up device in a Static Random Access Memory (SRAM). Such thin film transistors are formed on an insulating substrate and have a bottom gate type structure. Thin film transistors used in the SRAM application are highly advantageous in providing improved net die yield of the semiconductor device as compared to a typical full MOS transistor.

The conventional method will be described and illustrated with reference to the fabrication of a thin film transistor suitable for use as a pull-up device in a SRAM. Various of the steps and layers are illustrated in the cross-sectional views provided in the figures.

A semiconductor substrate 1 is provided on which a predetermined lower layer 2 is formed. This lower layer 2 is preferably an insulating film that covers patterns existing on the substrate. A gate electrode 3a is then formed on the lower layer 2. Reference numeral 3b shows a node contact line. A gate oxide film 4 is then formed on the lower layer 2, the gate electrode 3a, and the node contact line 3b. A polysilicon film is then deposited on the gate insulating film 4. In portions of the polysilicon layer disposed on either side of the gate electrode 3a, source and drain regions 5a, 5b are then formed using a conventional ion-implanting process by, for example, selectively implanting boron ions into the polysilicon film. As a result, a thin film transistor having a bottom gate type is fabricated. In this case, a portion of the polysilicon layer between the source region 5a and the drain region 5b acts as a channel region 5c. The source region 5a is partially overlapped with the gate electrode 5c. Also, the source/drain regions 5a, 5b are formed in such a way that a light doped offset region is formed in the drain region 5b in order to minimize the hot carrier effect.

However, in the prior art thin film transistor described above, the polysilicon layer acting as the channel layer is thin and thus has lower charge mobility than that provided by a typical bulk transistor. For this reason, the thin film transistor according to the prior art suffers from inferior electrical properties, such as a low on-current and a high off-current (i.e., leakage current), and thus exhibits increased signal swings.

Specifically, the polysilicon layer for the channel layer in the prior art thin film transistor has a thickness of, for example, only 200 to 300 Å. Even though the ion-implant that forms the source and drain regions utilizes a lightly doped offset (LDO) ion implantation process to minimize the hot carrier effect, the polysilicon channel layer becomes excessively doped as a result of its thinness. As a result of this excessive doping, the prior art thin film transistor exhibits degraded punch-through resistance and increased hot carrier effects.

SUMMARY OF THE INVENTION

It is therefore an object of the present invention to provide a method for the fabrication of a thin film transistor having improved electrical properties.

To achieve the above object, the present invention provides a method for fabricating a thin film transistor comprising the steps of: forming a gate electrode on an insulating substrate; forming a gate oxide film on the insulating substrate and gate electrode; depositing a polysilicon layer on the gate oxide film; implanting a first impurity ion into the polysilicon layer to control a threshold voltage of the polysilicon layer; forming a first ion-implanting mask on a portion of the polysilicon layer above the gate electrode, the first ion-implanting mask having the same width as that of the gate electrode; implanting a second impurity ion into the exposed region of the polysilicon layer using the first ion-implanting mask, to form a lightly doped offset region in the drain region; removing the first ion-implanting mask; forming a second ion-implanting mask on the polysilicon layer in such a manner that the second ion-implanting mask covers a portion of the gate electrode and the lightly doped offset region; implanting a third impurity ion into the polysilicon layer using the second ion-implanting mask to form source/drain regions; and removing the second ion-implanting mask.

This and other objects and aspects of the invention will be apparent from the following description of preferred embodiments and through reference to the accompanying figures.

DETAILED DESCRIPTION OF THE INVENTION

A preferred embodiment of a method according to the present invention will now be described with reference to FIGS. 2A to 2F. In this embodiment, a description will be given to a method for fabricating a thin film transistor suitable for use as a pull-up device in a SRAM.

Figure 1:
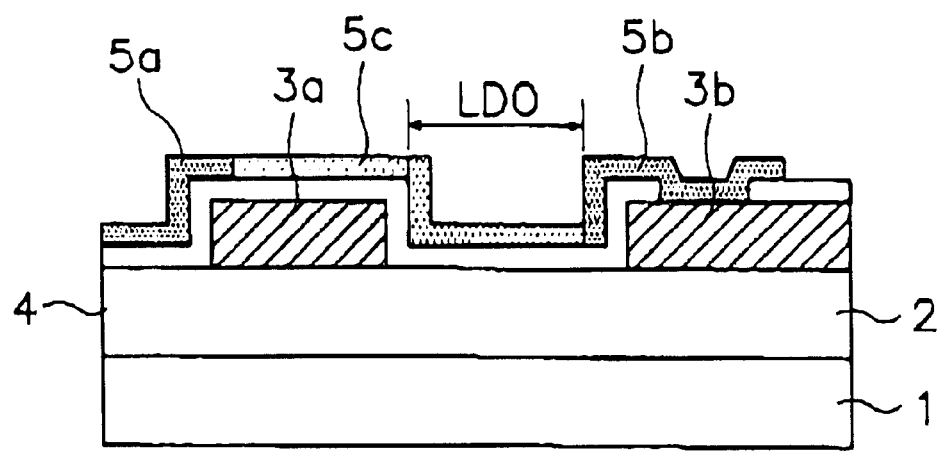
FIG. 1 is a cross-sectional view showing a prior art thin film transistor that is suitable for use as a pull-up device in a SRAM.
Figure 2A:
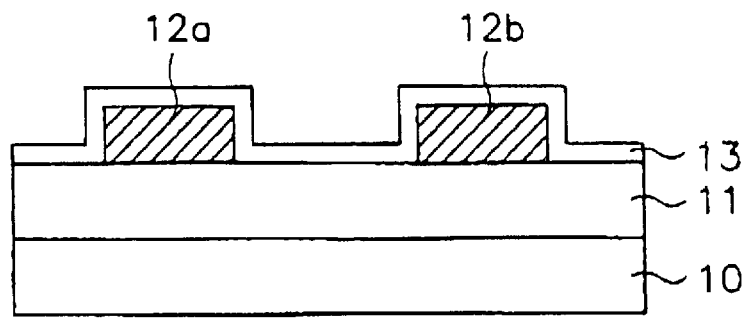
FIGS. 2A to 2F are cross-sectional views illustrating a method of fabricating a thin film transistor according to the present invention.

Referring to FIG. 2A, there is shown a semiconductor substrate 10 on which a predetermined lower layer 11 has been formed. The lower layer 11 is preferably an insulating film which is formed over the semiconductor substrate 10 so as to cover all existing patterns, such as transistors. Thus, the lower layer 11 may comprise an insulating substrate. A polysilicon layer for forming a gate is deposited on the lower layer, and patterned and etched by conventional photolithography and etch processes to form a gate electrode 12a. Reference numeral 12b represents a node contact line. A gate insulating film 13 is then deposited on the gate electrode 12a, the node contact line 12b and the lower layer 11. This gate insulating film 13 consists of a HTO (high temperature oxide) or MTO (middle temperature) film, which is deposited by low pressure chemical vapor deposition (LPCVD) or plasma enhanced chemical vapor deposition (PECVD) to a thickness of between about 100 and 2,000 Å.

Figure 2B:
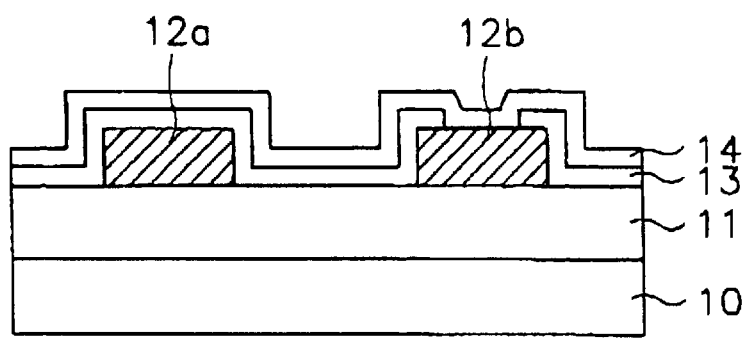

Referring to FIG. 2B, a portion of the gate insulating film 13 formed on the node contact line 12b is partially removed by conventional photolithography and etch processes. A polysilicon layer 14 for forming the channel layer is then deposited on the gate insulating film 13 and the exposed portion of the node contact line 12b. The polysilicon layer 14 for the channel layer is deposited by LPCVD to a thickness of between about 200 and 2,000 Å.

Figure 2C:
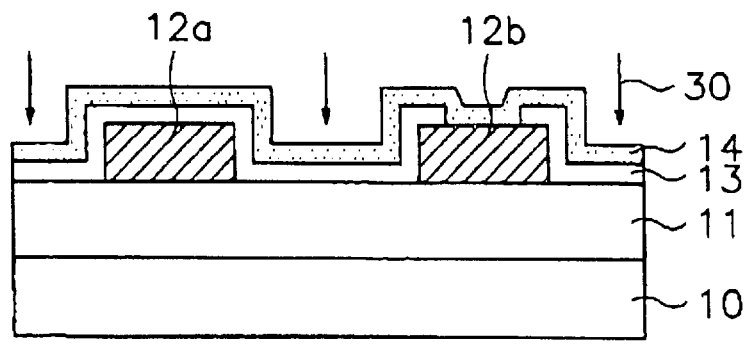

Referring to FIG. 2C, to control a threshold voltage of a thin film transistor being fabricated, a first impurity ion 30 is implanted into the entire polysilicon layer 14 intended for the channel layer without the use of a mask. The first impurity ion 30 may be either n-type or p-type, preferably using either $BF_2$ or P ions.

Figure 2D:
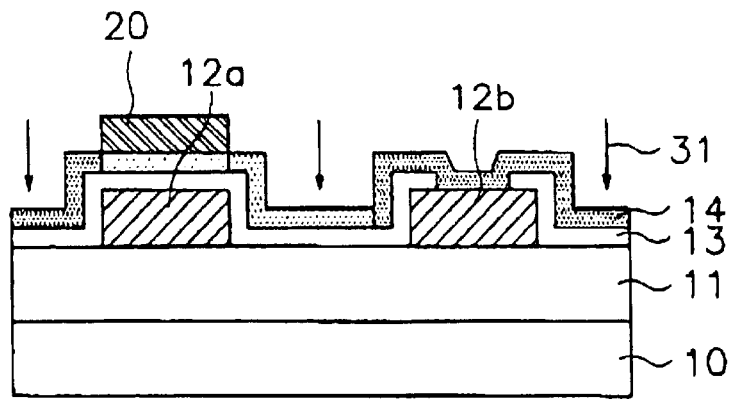

Referring to FIG. 2D, a first ion-implanting mask 20 is formed to protect that portion of the polysilicon layer 14 that will correspond to the channel region of the thin film transistor. The first ion-implanting mask 20 is preferably a photoresist pattern, and has the same width as that of the gate electrode 12a. To form a lightly doped offset region, a low concentration of a second impurity ion 31 is implanted into the exposed portion of the polysilicon layer 14. The step of implanting the second impurity ion includes a first sub-step of implanting a $BF_2$ ion and a second sub-step of implanting a $N_2$ ion, the first and second sub-steps being carried out sequentially. The second sub-step of implanting the $N_2$ ion preferably provides a dopant concentration of $10^{13}$ to $10^{16}$ ions/$cm^2$ at an ion implantation energy of 30 to 50 KeV.

Figure 2E:
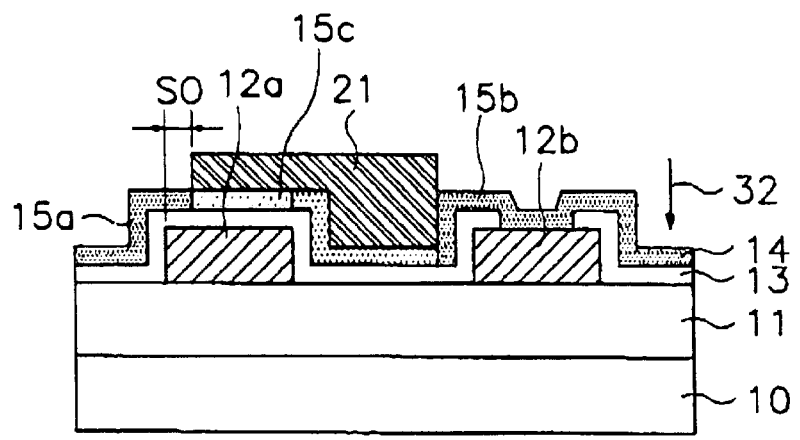

Referring to FIG. 2E, after the first ion-implanting mask is removed, the second ion-implanting mask 21 is formed on the polysilicon layer that was subjected to the previous double impurity-ion implantation. Like the first ion-implanting mask, the second ion-implanting mask 21 is preferably a photoresist pattern. This second ion-implanting mask 21 is formed in such a manner that it covers a portion of the polysilicon layer 14 above the gate electrode 12a, and opens that portion of polysilicon layer 14 above the gate electrode 12a intended for the lightly doped offset region. A third impurity ion is then implanted into the exposed portion of the polysilicon layer at high concentrations to form source/drain regions 15a, 15b. In this regard, the source region 15a partially overlaps the gate electrode 12a, so that the width of the channel region 15c is decreased by the width of the source overlap region (SO), and the source region 15a is enlarged by the width of the source overlap region (SO). The source overlap region (SO) has a width of 0.09 to 0.11 μm, preferably about 0.1 μm. Also, the drain region 15b includes a lightly doped offset (LDO) region. A portion of the polysilicon layer disposed between the source region 15a and the LDO region is the channel region 15c.

Figure 2F:
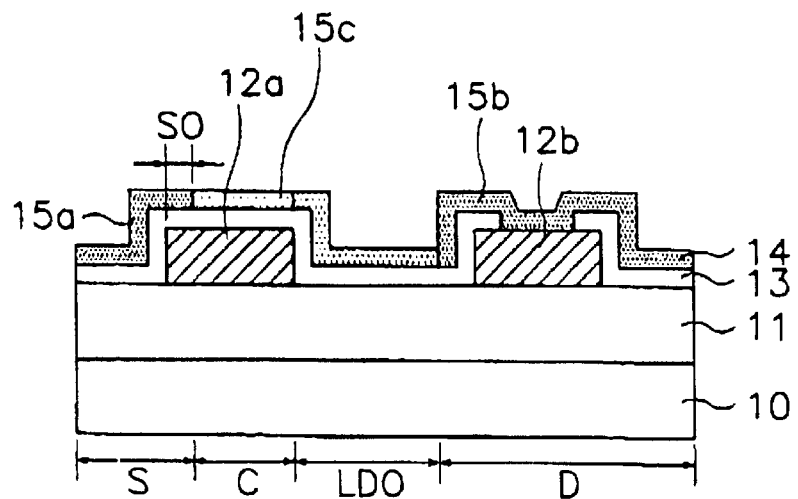

Referring to FIG. 2F, the second ion-implanting mask is removed to fabricate a thin film transistor.

The thin film transistor of the present invention fabricated as described above minimizes the hot carrier effect caused by the boron ion diffusion and also exhibits improved punch-through properties.

Figure 3:
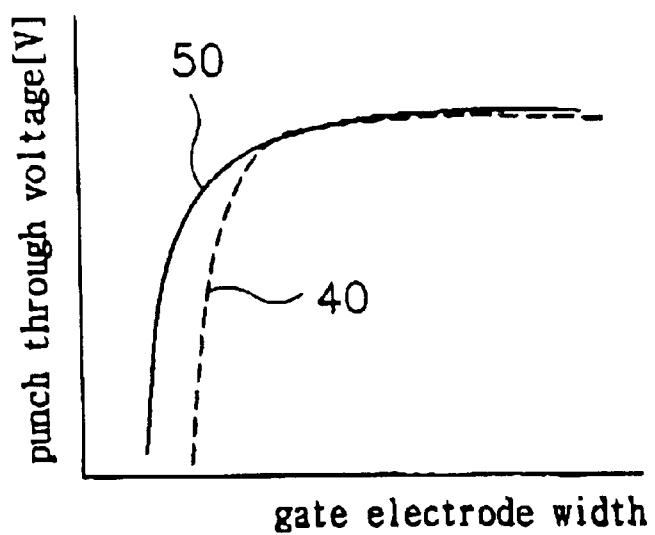
FIG. 3 is a graph showing punch-through voltage as a function of a gate electrode width, for a thin film transistor according to the prior art and a thin film transistor according to the present invention.

FIG. 3 is a graph showing punch-through voltage as a function of gate electrode width for both a thin film transistor according to the prior art and a thin film transistor according to the present invention.

As shown in FIG. 3, the punch-through voltage 50 for the thin film transistor implanted with the $N_2$ ion according to the present invention is greatly increased at narrower gate electrode widths, when compared to the punch-through voltage 40 obtained by the prior art thin film transistor which did not receive the $N_2$ ion implant.

Accordingly, as the method of the present invention provides a thin film transistor exhibiting excellent punch-through properties, it enables the fabrication of highly integrated semiconductor devices having excellent electrical properties.

Meanwhile, although the embodiment as described above illustrates the fabrication of the thin film transistor suitable for use as the pull-up device in a SRAM, the method of the present invention may likewise be applied to the fabrication of a thin film transistor for driving liquid crystal displays.

As is apparent from the foregoing description, the method for fabricating the thin film transistor according to the present invention includes implanting $N_2$ ions after implanting the $BF_2$ ions, during the impurity ion implantation step to form a lightly doped offset region. The implanted nitrogen ions inhibit diffusion of the boron ions. Accordingly, the method according to the present invention can minimize the adverse influence of the hot carriers and improve the punch-through properties of the resulting thin film transistors. As a result, the present method can be used to produce highly integrated semiconductor devices having improved electrical properties.

Although the preferred embodiments of the invention have been disclosed for illustrative purposes, those skilled in the art will appreciate that various modifications, additions and substitutions are possible without departing from the scope and spirit of the invention as disclosed in the accompanying claims.

What is claimed is:

1. A method for the fabrication of a thin film transistor, comprising:

forming a gate electrode on an insulating substrate;

forming a gate oxide film on the insulating substrate and the gate electrode;

depositing a polysilicon layer on the gate oxide film;

implanting a BF2 ion into the entire polysilicon layer to control a threshold voltage of the polysilicon layer;

forming a first mask on a portion of the polysilicon layer placed on the gate electrode, the first mask having approximately the same width as that of the gate electrode;

implanting a BF2 ion and then implanting a N2 ion into the exposed portion of the polysilicon layer using the first mask, to form a lightly doped offset region on a region intended for a drain region, the N2 ion implanted into the polysilicon layer passes through the diffusion paths of the boron ions and inhibits the diffusion of the boron ion;

removing the first mask;

forming a second mask on the polysilicon layer in such a manner that the second ion-implanting mask covers a portion of the gate electrode and the lightly doped offset region; implanting an ion into the polysilicon layer using the second ion implanting mask to form source/drain regions; and removing the second mask.

2. The method of claim 1, in which the gate oxide film consists of a high temperature oxide (HTO) or middle temperature oxide (MTO) film.

3. The method of claim 2, in which the gate oxide film is formed by Low Pressure Chemical Vapor Deposition (LPCVD) or Plasma Enhanced Chemical Vapor Deposition (PECVD).

4. The method of claim 3, in which the gate oxide film has a thickness of about 100 to 2000 Å.

5. The method of claim 1, in which the polysilicon layer is formed by Low Pressure Chemical Vapor Deposition (LPCVD).

6. The method of claim 5, in which the polysilicon layer has a thickness of about 100 to 2000 Å.

7. The method of claim 1, in which the first and second masks consist of a photoresist pattern.

8. The method of claim 1, in which the $N_2$ ion is implanted at a dopant concentration of between $10^{13}$ and $10^{16}$ ions/cm$^2$ and at an ion implantation energy of between 30 and 50 KeV.

9. The method of claim 1, in which the source region is formed in such a manner that it partially overlaps with the gate electrode.

10. The method of claim 9, in which the overlap width of the source region is between about 0.09 and 0.11 μm.

* * * * *